United States Patent
Noborio et al.

(10) Patent No.: US 12,211,902 B2
(45) Date of Patent: Jan. 28, 2025

(54) SILICON CARBIDE SEMICONDUCTOR DEVICE AND METHOD FOR MANUFACTURING THE SAME

(71) Applicant: DENSO CORPORATION, Kariya (JP)

(72) Inventors: Masato Noborio, Kariya (JP); Takehiro Kato, Toyota (JP); Yusuke Yamashita, Nagakute (JP)

(73) Assignee: DENSO CORPORATION, Kariya (JP)

( * ) Notice: Subject to any disclaimer, the term of this patent is extended or adjusted under 35 U.S.C. 154(b) by 497 days.

(21) Appl. No.: 17/520,882

(22) Filed: Nov. 8, 2021

(65) Prior Publication Data

US 2022/0059657 A1 Feb. 24, 2022

Related U.S. Application Data

(63) Continuation of application No. PCT/JP2020/020300, filed on May 22, 2020.

(30) Foreign Application Priority Data

May 23, 2019 (JP) ................................. 2019-096864

(51) Int. Cl.
| | |
|---|---|
| *H01L 29/10* | (2006.01) |
| *H01L 21/04* | (2006.01) |
| *H01L 21/76* | (2006.01) |
| *H01L 21/761* | (2006.01) |
| *H01L 29/06* | (2006.01) |
| *H01L 29/16* | (2006.01) |

(Continued)

(52) U.S. Cl.
CPC ........ *H01L 29/1095* (2013.01); *H01L 21/046* (2013.01); *H01L 21/7602* (2013.01); *H01L 21/761* (2013.01); *H01L 29/0623* (2013.01); *H01L 29/1608* (2013.01); *H01L 29/66068* (2013.01); *H01L 29/7811* (2013.01); *H01L 29/7813* (2013.01)

(58) Field of Classification Search
CPC ............. H01L 29/1095; H01L 29/0623; H01L 29/1608; H01L 29/66068; H01L 29/7811; H01L 29/7813; H01L 21/046; H01L 21/7602; H01L 21/761
See application file for complete search history.

(56) References Cited

U.S. PATENT DOCUMENTS

| | | | |
|---|---|---|---|
| 2013/0001592 A1* | 1/2013 | Miyahara | ............ H01L 29/4236 257/77 |
| 2016/0133741 A1 | 5/2016 | Matsuki et al. | |
| 2017/0229535 A1 | 8/2017 | Hatta et al. | |

(Continued)

FOREIGN PATENT DOCUMENTS

| | | | |
|---|---|---|---|
| JP | 2012-209344 A | 10/2012 | |
| JP | 2015-135862 A | 7/2015 | |
| JP | 6914624 B2 * | 8/2021 | ............. H01L 29/06 |

*Primary Examiner* — Fernando L Toledo
*Assistant Examiner* — Marshall Mu-Nuo Hatfield
(74) *Attorney, Agent, or Firm* — Posz Law Group, PLC (57) ABSTRACT

In a semiconductor device, a source region is made of an epitaxial layer so as to reduce variation in thickness of a base region and variation in a threshold value. Outside of a cell part, a side surface of a gate trench is inclined relative to a normal direction to a main surface of a substrate, as compared with a side surface of a gate trench in the cell part that is provided by the epitaxial layer of the source region being in contact with the base region.

8 Claims, 8 Drawing Sheets

(51) Int. Cl.
    *H01L 29/66*     (2006.01)
    *H01L 29/78*     (2006.01)

(56) References Cited

U.S. PATENT DOCUMENTS

| | | | |
|---|---|---|---|
| 2018/0158938 A1 | 6/2018 | Kyogoku et al. | |
| 2018/0315819 A1* | 11/2018 | Tanaka | H01L 29/7811 |
| 2018/0358431 A1* | 12/2018 | Kagawa | H01L 29/1608 |
| 2019/0074386 A1* | 3/2019 | Ebihara | H01L 29/1608 |
| 2019/0157398 A1* | 5/2019 | Utsumi | H01L 29/0623 |
| 2019/0288105 A1* | 9/2019 | Hisada | H01L 29/4236 |
| 2020/0243641 A1* | 7/2020 | Nakagawa | H01L 29/0623 |

\* cited by examiner

SILICON CARBIDE SEMICONDUCTOR DEVICE AND METHOD FOR MANUFACTURING THE SAME

CROSS REFERENCE TO RELATED APPLICATIONS

The present application is a continuation application of International Patent Application No. PCT/JP2020/020300 filed on May 22, 2020, which designated the U.S. and claims the benefit of priority from Japanese Patent Application No. 2019-96864 filed on May 23, 2019. The entire disclosures of all of the above applications are incorporated herein by reference.

TECHNICAL FIELD

The present disclosure relates to a silicon carbide (SiC) semiconductor device having a vertical semiconductor element with a trench gate structure made of SiC, and a method for manufacturing the same.

BACKGROUND

Conventionally, there has been a SiC semiconductor device having a trench gate structure as a structure in which a channel density is increased so as to allow a large current to flow. In such a SiC semiconductor device, a p-type base region and an $n^+$-type source region are sequentially formed on an n-type drift layer, and a trench gate structure is formed so as to extend through the p-type base region from the surface of the $n^+$-type source region and to reach the n-type drift layer. Specifically, the p-type base region is epitaxially grown on the n-type drift layer, and then an n-type impurity is implanted into the p-type base region by ion implantation to invert a part of the p-type base region into the n-type, thereby forming the $n^+$-type source region.

SUMMARY

The present disclosure describes a silicon carbide semiconductor device and a method for manufacturing the silicon carbide semiconductor device. The silicon carbide semiconductor device includes a substrate, a drift layer, a base region, a source region, a trench gate structure, an interlayer insulating film, a first electrode, and a second electrode. The substrate is a first conductivity type or a second conductivity type, and is made of silicon carbide. The drift layer is the first conductivity type, and is made of the silicon carbide. The drift layer has an impurity concentration lower than that of the substrate. The base region is the second conductivity type, and is made of the silicon carbide and disposed above the drift layer. The source region is the first conductivity type, has an impurity concentration higher than that of the drift layer and is disposed in a cell part above the base region. The source region has an epitaxial layer of the silicon carbide at least at a part being in contact with the base region. The trench gate structure is disposed in a gate trench, and includes a gate insulating film disposed on an inner wall surface of the gate trench and a gate electrode disposed on the gate insulating film. The gate trench has a depth from a front surface of the source region to a position deeper than the base region, and includes a linear portion that defines a longitudinal direction in a direction and extends from the cell part to a position outside of the cell part. The interlayer insulating film is disposed above the source region and the trench gate structure, and has a contact hole connecting to the source region. The first electrode is disposed on the interlayer insulating film and electrically connected to the source region through the contact hole. The second electrode is electrically connected on a back surface side of the substrate. Further, a side surface of the gate trench outside of the cell part is inclined relative to a normal direction to the main surface of the substrate, as compared with a side surface of the gate trench in the cell part provided by the epitaxial layer of the source region that is in contact with the base region.

DETAILED DESCRIPTION

In a semiconductor device, a variation in film thickness caused during epitaxial growth is likely to increase as a film thickness to be grown is large, but a variation in ion implantation range is not so large. Therefore, the variation in the film thickness of a p-type base region after ion implantation is a variation corresponding to the film thickness by the epitaxial growth. As a result, in a case where an $n^+$-type source region is formed into the p-type base region by the ion implantation, the variation in thickness of the $n^+$-type source region is small, but the variation in thickness of the p-type base region in which a channel region is formed is large. Therefore, a variation in the threshold value Vt may occur.

The inventors of the present application studied a situation in which not only the p-type base region is formed through the epitaxial growth but also the n$^+$-type source region is formed through the epitaxial growth. As a result, since the variation in thickness is distributed to the p-type base region and the n$^+$-type source region, it is possible to reduce the variation in thickness of the p-type base region and thus suppress the variation in the threshold value Vt. Further, in a case where the n$^+$-type source region is formed by the epitaxial growth, the trench gate structure can be made to have a side surface substantially perpendicular to the surface of the n$^+$-type source region.

In such a configuration, however, it was confirmed that a thickness of a gate insulating film is reduced at the corner on the trench inlet side, and the gate insulating film is likely to be destroyed at the thinned portion when being applied with a large electric field, resulting in the deterioration in gate life.

In the trench gate structure, a gate liner to extend the gate electrode to the outside of the gate trench is provided at least at one of both ends in the longitudinal direction. The liner is also disposed on the thinned portion of the gate insulating film. Therefore, it is considered that a large electric field is applied to the portion of the gate insulating film provided with the gate liner, and hence the gate insulating film is destroyed.

The present disclosure provides a SiC semiconductor device having a structure capable of suppressing a variation in a threshold value Vt and suppressing a decrease in gate life, and a method for manufacturing the same.

A silicon carbide semiconductor device according to an aspect of the present disclosure, includes: a substrate of a first conductivity type or a second conductivity type, the substrate being made of silicon carbide, and having a main surface; a drift layer of the first conductivity type, the drift layer being made of the silicon carbide and having an impurity concentration lower than that of the substrate, the drift layer being disposed adjacent to the main surface of the substrate; a base region of the second conductivity type, the base region being made of the silicon carbide and disposed above the drift layer; a source region of the first conductivity type, the source region having an impurity concentration higher than that of the drift layer and being disposed in a cell part above the base region, the source region having an epitaxial layer of the silicon carbide at least at a part being in contact with the base region; a trench gate structure being disposed in a gate trench, and including a gate insulating film disposed on an inner wall surface of the gate trench and a gate electrode disposed on the gate insulating film, the gate trench having a depth from a front surface of the source region to a position deeper than the base region, the gate trench including a linear portion that defines a longitudinal direction in a direction and extends from the cell part to a position outside of the cell part; an interlayer insulating film being disposed above the source region and the trench gate structure, and having a contact hole connecting to the source region; a first electrode being disposed on the interlayer insulating film and electrically connected to the source region through the contact hole; and a second electrode being electrically connected on a back surface side of the substrate. Further, a side surface of the gate trench outside of the cell part is inclined relative to a normal direction to the main surface of the substrate, as compared with a side surface of the gate trench in the cell part provided by the epitaxial layer of the source region that is in contact with the base region.

As described above, since at least the portion of the source region in contact with the base region is provided by the epitaxial growth layer, it is possible to reduce the variation in the thickness of the base region and hence suppress the variation in the threshold value Vt. Further, the side surface of the gate trench in a region outside the cell part is inclined relative to the normal direction of the main surface of the substrate, as compared with the side surface of the gate trench in the cell part provided by the epitaxial growth layer of the source region being in contact with the base region. Therefore, even if the gate insulating film has a thin film portion in the cell part, the gate insulating film can have a thick film portion in the region outside the cell part. As such, it is possible to suppress the destruction of the gate insulating film due to the application of a large electric field at both ends of the trench gate structure in the longitudinal direction. Further, it is possible to suppress the deterioration in the life of the gate insulating film.

A method for manufacturing a silicon carbide semiconductor device according to another aspect of the present disclosure, includes: preparing a substrate of a first conductivity type or a second conductivity type, the substrate being made of silicon carbide and having a main surface; forming a drift layer of the first conductivity type on the substrate, the drift layer being made of the silicon carbide and having an impurity concentration lower than that of the substrate; forming a base region of the second conductivity type on the drift layer, the base region being made of the silicon carbide; forming a source region of the first conductivity type on the base region, the source region being made of the silicon carbide by an epitaxial growth and having an impurity concentration higher than the drift layer; forming the gate trench structure by forming a gate trench, forming a gate insulating film on an inner wall surface of the gate trench, and forming a gate electrode on the gate insulating film, the gate trench being formed to extend from a front surface of the source region to a position deeper than the base region and to have a linear portion that defines a longitudinal shape in one direction and extends from the cell part to a position outside of the cell part; forming an interlayer insulating film above the source region and the trench gate structure, the interlayer insulating film having a contact hole connecting to the source region; forming a first electrode electrically connected to the source region through the contact hole; and forming a second electrode adjacent to a back surface of the substrate. Further, the forming of the trench gate structure includes inclining a side surface of the gate trench outside of the cell part relative to a normal direction to the main surface of the substrate, as compared with a side surface of the gate trench in the cell part provided by a portion of the source region that is in contact with the base region and formed by the epitaxial growth.

As described above, by forming the source region on the base region by the epitaxial growth, it is possible to reduce the variation in the thickness of the base region and hence suppress the variation in the threshold value Vt. Further, when forming the trench gate structure, the side surface of the gate trench is inclined relative to the normal direction to the main surface of the substrate outside the cell part, as compared with the side surface of the gate trench in the cell part provided by the epitaxial layer of the source region being in contact with the base region. Therefore, even if the gate insulating film has a thin film portion in the cell part, the gat insulating film can have a thick film portion outside the cell part. As such, it is possible to suppress the destruction of the gate insulating film due to the application of a large electric field at both ends of the trench gate structure in the longitudinal direction, and it is possible to suppress the deterioration in the life of the gate insulating film.

Hereinafter, embodiments of the present disclosure will be described with reference to the drawings. In the embodiments described hereinafter, the same or equivalent parts will be designated with the same reference numerals.

First Embodiment

A first embodiment will be described. A SiC semiconductor device in which an inverted MOSFET is formed as a vertical semiconductor element having a trench gate structure will be described as an example.

Figure 1:
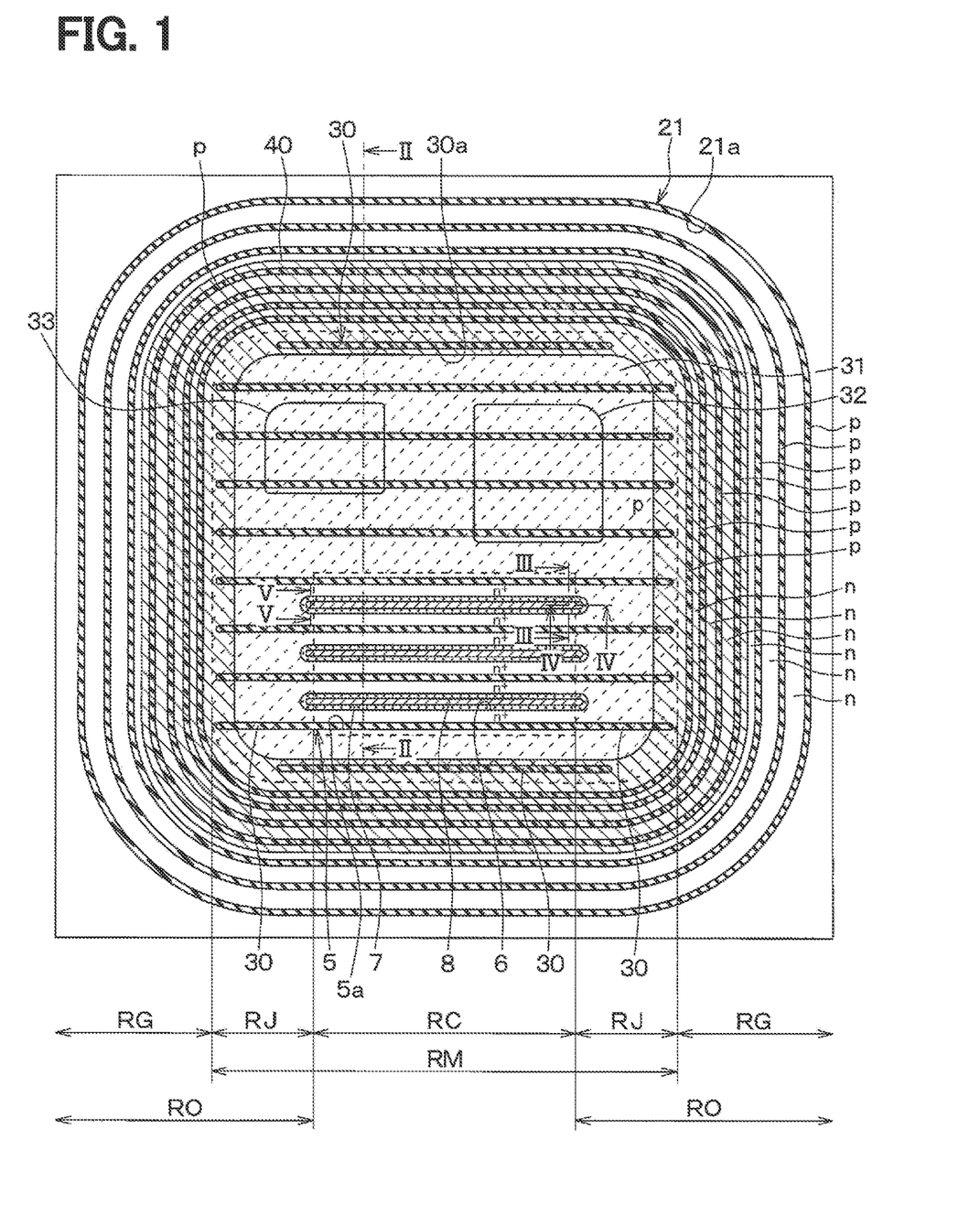
FIG. 1 is a diagram schematically showing an upper layout of a SiC semiconductor device according to a first embodiment.

A SiC semiconductor device shown in FIG. 1 has a cell part RC formed with a MOSFET having a trench gate structure and an outer peripheral part RO surrounding the cell part RC. The outer peripheral part RO has a guard ring part RG and a connecting part RJ arranged inside the guard ring part RG, that is, between the cell part RC and the guard ring part RG. Although FIG. 1 is not a cross-sectional view, hatching is partially shown in order to make the figure easily understandable.

Figure 2:
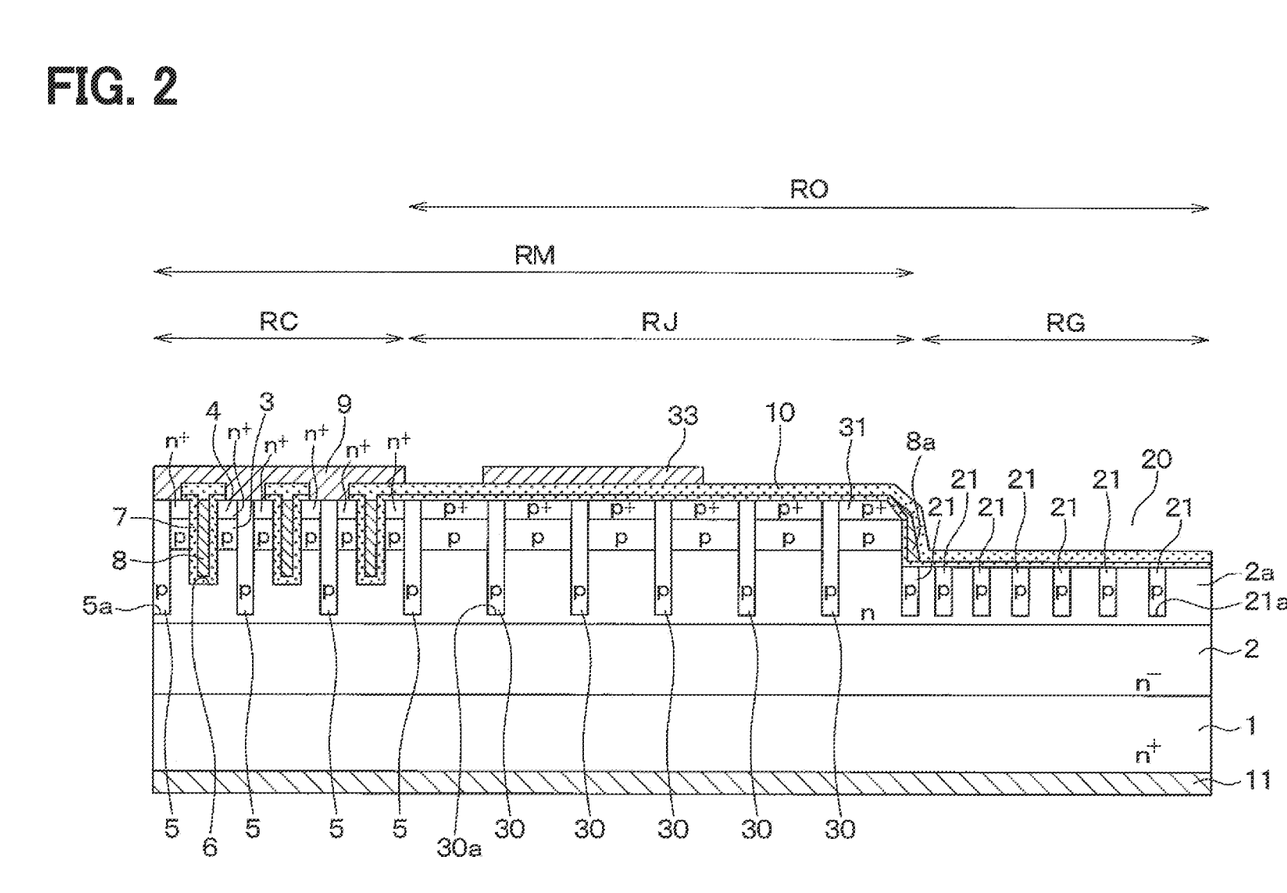
FIG. 2 is a cross-sectional view taken along a line II-II in FIG. 1.

As shown in FIG. 2, the SiC semiconductor device is formed by using an n$^+$-type substrate 1 made of SiC. An n$^-$-type impurity layer, an n$^-$-type current dispersion layer 2a, a p-type base region 3, and an n$^+$-type source region 4, which are made of SiC, are epitaxially grown on top of another on the main surface of the n$^+$-type substrate 1.

The n$^+$-type substrate 1 has, for example, an n-type impurity concentration of $1.0 \times 10^{19}/cm^3$, and a surface of the n$^+$-type substrate 1 is a (0001) Si surface. The n$^-$-type impurity layer 2 has, for example, an n-type impurity concentration of $0.5 \times 10^{16}/cm^3$ to $2.0 \times 10^{16}/cm^3$. The n-type current dispersion layer 2a has a higher n-type impurity concentration, that is, a lower resistance than the n$^-$-type impurity layer 2, and has a role of reducing JFET resistance by dispersing and flowing a current over a wider range. For example, the n-type current dispersion layer 2a has a thickness of, for example, $8 \times 10^{16}/cm^3$ and a thickness of 0.5 μm. Although the n$^-$-type impurity layer 2 and the n-type current dispersion layer 2a are described as different layers for the convenience, both of the n$^-$-type impurity layer 2 and the n-type current dispersion layer 2a form a drift layer.

In addition, the p-type base region 3 is a region in which a channel region is formed. The p-type base region 3 has an impurity concentration of, for example, approximately $2.0 \times 10^{17}/cm^3$ and the thickness of 300 nm. The n$^+$-type source region 4 has a higher impurity concentration than the n$^-$-type impurity layer 2. The n$^+$-type source region 4 has an n-type impurity concentration of, for example, $2.5 \times 10^{18}$ to $1.0 \times 10^{19}/cm^3$ in a surface layer portion, and a thickness of about 0.5 μm.

In the cell part RC, the p-type base region 3 and the n$^+$-type source region 4 are left on the surface side of the n$^+$-type substrate 1. In a connecting part RJ, the n$^+$-type source region 4 is replaced with an ion implantation layer 31, which will be described later. In the guard ring part RG, a recess portion 20 is formed so as to penetrate the n$^+$-type source region 4 or the ion implantation layer 31 and the p-type base region 3 and to reach the n-type current dispersion layer 2a.

In the cell part RC, the p-type deep layer 5 is formed so as to penetrate the n$^+$-type source region 4 and the p-type base region 3 and reach the n-type current dispersion layer 2a. The p-type deep layer 5 has a p-type impurity concentration higher than that of the p-type base region 3. Specifically, a plurality of the p-type deep layers 5 are arranged in stripe-shaped trenches 5a that are arranged in the n-type current dispersion layer 2a at equal intervals apart from each other without intersecting, and are provided by a p-type epitaxial film formed by epitaxial growth. The trench 5a has, for example, a width of 1 μm or less and an aspect ratio of 2 or more.

For example, each p-type deep layer 5 has a p-type impurity concentration of about $1.0 \times 10^{17}$ to $1.0 \times 10^{19}/cm^3$ a width of about 0.7 μm and a depth of about 2.0 μm. The deepest bottom portion of each p-type deep layer 5 is located at the same position as a boundary position between the n-type current dispersion layer 2a and the n$^-$-type impurity layer 2, or at a position closer to the p-type base region 3 than the boundary position. That is, the p-type deep layer 5 and the n-type current dispersion layer 2a are formed to have the same depth, or the n-type current dispersion layer 2a is formed in a depth deeper than the p-type deep layer 5. As shown in FIG. 1, the p-type deep layer 5 is formed from one end to the other end of the cell part RC. The p-type deep layer 5 is extended to have a longitudinal direction same as the trench gate structure, which will be described later, and is further extended more than both ends of the trench gate structure to connect to a p-type connecting layer 30, described later, which is extended outside of the cell part RC.

Further, a gate trench 6 is formed so as to penetrate the p-type base region 3 and the n$^+$-type source region 4 and reach the n$^-$-type impurity layer 2. For example, the gate trench 6 has a width of 0.8 μm and a depth of 1.0 μm. The gate trench 6 is formed not only in the cell part RC but also protruding from the cell part RC to the connecting part RJ. The above-described p-type base region 3, n$^+$-type source region 4, and ion implantation layer 31 are arranged so as to be in contact with side surfaces of the gate trench 6. More specifically, in the cell part RC, the n$^+$-type source region 4 forms a side surface of the gate trench 6 on an inlet side of the gate trench 6, and in the connecting part RJ, the ion implantation layer 31 forms a side surface of the gate trench on an inlet side of the gate trench 6. The gate trench 6 is formed in a layout of having a linear portion that defines a width direction in a left and right direction of FIG. 2, a longitudinal direction in a direction normal to the paper surface of FIG. 2, and a depth direction in an up and down direction in FIG. 2. As shown in FIG. 1, the gate trench 6 has only a linear portion in the cell part RC. In the present embodiment, further, the gate trench 6 has only a linear portion also in the connecting part RJ. A plurality of the gate trenches 6 are provided. The gate trenches 6 are arranged in parallel at equal intervals to form a stripe shape, and each of the gate trenches 6 is interposed between the p-type deep layers 5.

Figure 3:
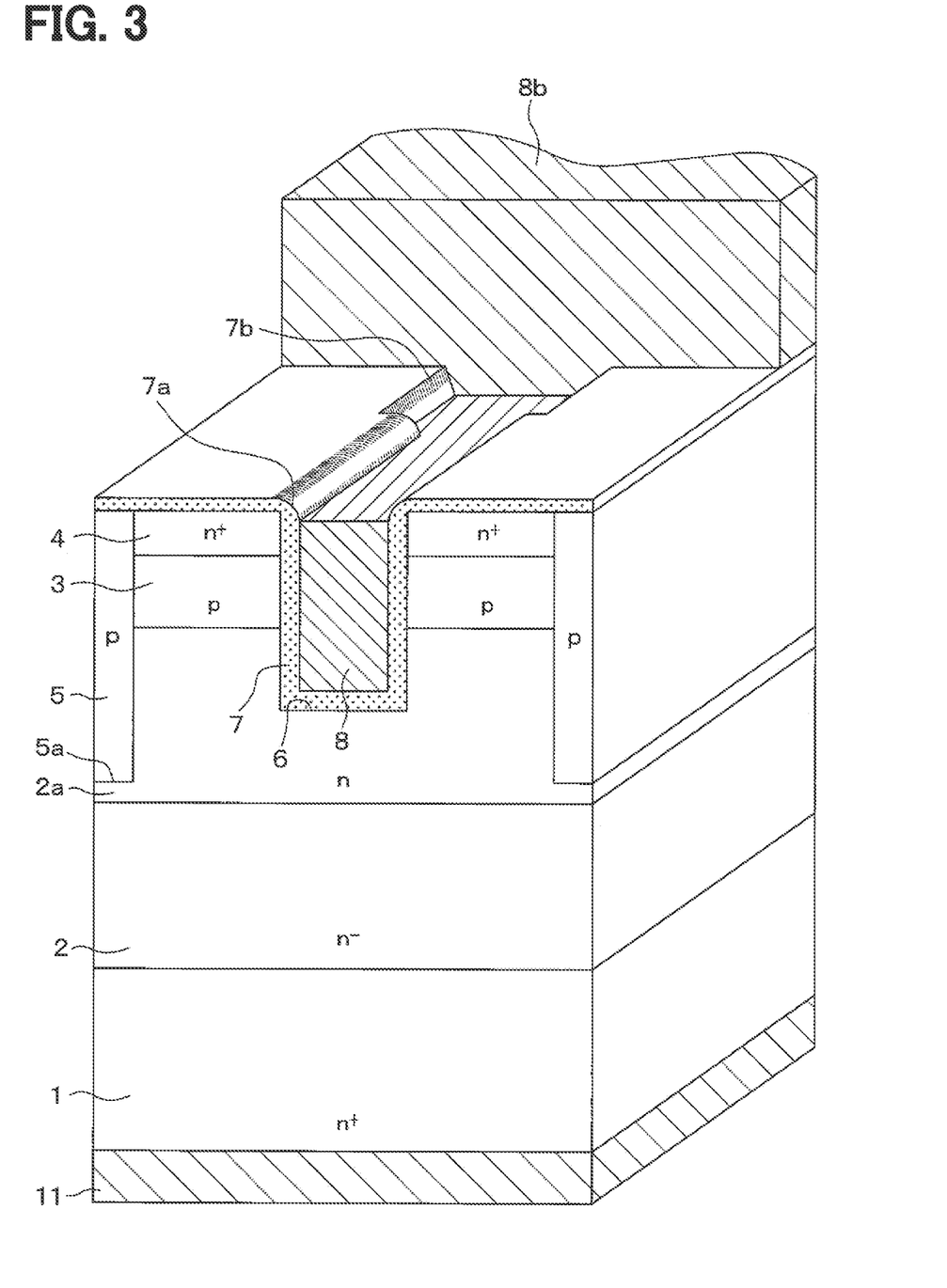
FIG. 3 is a cross-sectional and perspective view taken along a line III-III in FIG. 1 from which a part above an interlayer insulating film is omitted.
Figure 4:
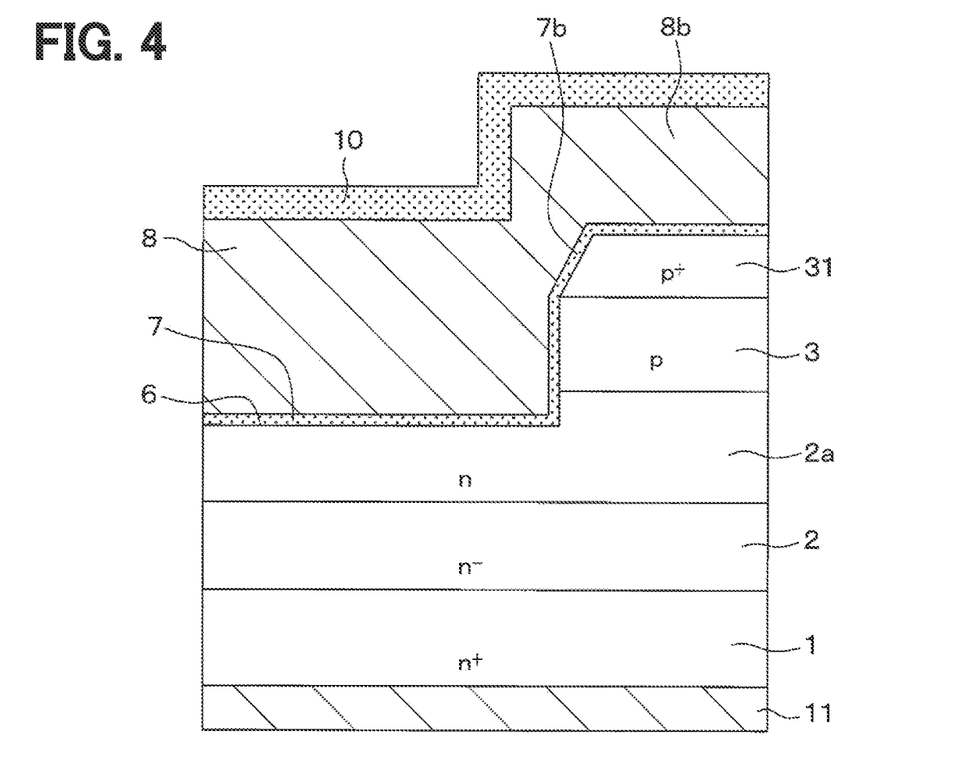
FIG. 4 is a cross-sectional view taken along a line IV-IV in FIG. 1.
Figure 5:
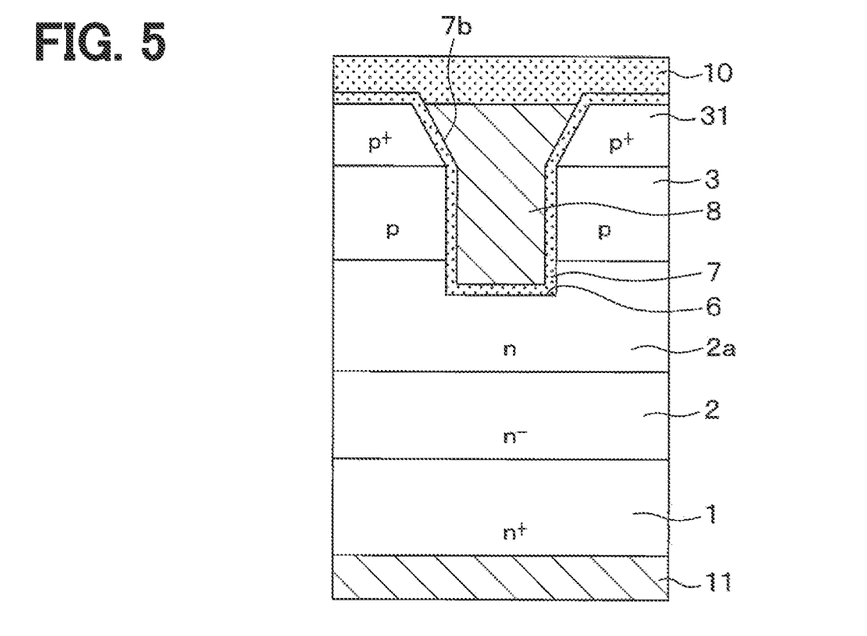
FIG. 5 is a cross-sectional view taken along a line V-V in FIG. 1.

In the present embodiment, as shown in FIGS. 2, 3 and 5, the shape of the side surface of the gate trench 6 is different between the inside of the cell part RC and the inside of the connecting part RJ. Specifically, in the cell part RC, the side surface of the gate trench 6 is perpendicular to the main surface of the n$^+$-type substrate 1. In the connecting part RJ, the surface of the inlet portion of the gate trench 6 is inclined relative to the normal direction to the main surface of the n$^+$-type substrate 1 such that the width of the trench is wider at the inlet portion of the trench than the bottom portion. As shown in FIG. 4, at the tip portion of the gate trench 6, the surface of the inlet portion of the gate trench 6 is inclined relative to the normal direction to the main surface of the n+-type substrate 1, similar to the shape of the side surface of the gate trench 6 in the connecting part RJ. Hereinafter, the inclined portions of the side surface and the tip portion of the gate trench 6 are referred to as the inclined portions.

A portion of the p-type base region 3 located at the side surface of the gate trench 6 functions as a channel region that connects between the n+-type source region 4 and the n−-type impurity layer 2 during the operation of the vertical MOSFET. A gate insulation film 7 is formed on the inner wall surface of the gate trench 6 including the channel region. The gate insulating film 7 is made of a thermal oxide film. A gate electrode 8 made of doped poly-Si is formed on a surface of the gate insulating film 7. Thus, the gate trench 6 is filled with the gate insulating film 7 and the gate electrode 8. As a result, a trench gate structure is formed.

The gate insulating film 7 is formed on the entire inner wall surface of the gate trench 6. However, the thickness of the gate insulating film 7 is different depending on a position. Specifically, in a part of the gate trench 6 located inside the cell part RC, that is, in a part of the gate trench 6 where the side surface is provided by the n+-type source region 4 and the side surface is perpendicular to the main surface of the n+-type substrate 1, the thickness of the gate insulating film 7 is thin at a corner of the inlet of the gate trench 6. Hereinafter, the portion of the gate insulating film 7 thinned in this portion is referred to as a thin film portion 7a. In a part of the gate trench 6 located in the connecting part RJ outside the cell part RC, that is, in a part of the gate trench 6 in which ion implantation layer 31 described later is formed on the side surface and the side surface includes the inclined portion, the thickness of the gate insulating film 7 is thicker than the thickness of the thin film portion 7a. Hereinafter, the gate insulating film 7 in this part is referred to as a thick film portion 7b.

Further, a source electrode 9, corresponding to a first electrode, is formed on the surfaces of the n+-type source region 4 and the p-type deep layer 5 and on the gate electrode 8 via an interlayer insulating film 10. The source electrode 9 is made of multiple metals, for example, Ni/Al or the like. Of the multiple metals, at least a portion being in contact with an n-type SiC, specifically, at least a portion being in contact with the n+-type source region 4 is made of a metal that is capable of having an ohmic contact with the n-type SiC. Further, of the multiple metals, at least a portion being in contact with a p-type SiC, specifically, a portion being in contact with the p-type deep layers 5 is made of a metal that is capable of having an ohmic contact with the p-type SiC. The source electrode 9 is electrically insulated as being formed on the interlayer insulating film 10. The source electrode 9 is electrically in contact with the n+-type source region 4 and the p-type deep layers 5 via a contact hole formed in the interlayer insulating film 10.

Further, a drain electrode 11, corresponding to a second electrode, is formed on a back surface of the n+-type substrate 1 to be electrically connected to the n+-type substrate 1. Such a structure forms an n-channel inversion type trench gate structure MOSFET. A plurality of such MOSFETs are arranged to thereby form the cell part RC.

On the other hand, the guard ring part RG is formed with the recess portion 20 that penetrates the ion implantation layer 31, which will be described later, and the p-type base region 3 and reaches the n-type current dispersion layer 2a, as described above. Therefore, at a position away from the cell part RC, the ion implantation layer 31 and the p-type base region 3 are removed, and the n-type current dispersion layer 2a is exposed. Further, the cell part RC and the connecting part RJ located on an inner side of the recess portion 20 are protruded in the thickness direction of the n+-type substrate 1 in an island shape, thereby to form a mesa part RM. On the side surface of the recess portion 20, that is, at the boundary position between the mesa part RM and the recess portion 20, the corner of the mesa part RM is inclined. The gate insulating film 7 is also formed in the recess portion 20, and the interlayer insulating film 10 is formed on the gate insulating film 7. However, a residue 8a of the poly-Si used for forming the gate electrode 8 may remain at the boundary position between the recess portion 20 and the mesa part RM.

Further, a plurality of p-type guard rings 21 are provided in a surface layer portion of the n-type current dispersion layer 2a located below the recess portion 20 so as to surround the cell part RC. In the present embodiment, the p-type guard rings 21 each have a rectangular shape with four rounded corners. Alternatively, the p-type guard ring 21 may have another frame shape such as a circular shape. The p-type guard ring 21 is arranged in a trench 21a formed in the n-type current dispersion layer 2a, and is made of a p-type epitaxial film formed by epitaxial growth. The trench 21a has, for example, a width of 1 μm or less and an aspect ratio of 2 or more.

Each part constituting the p-type guard ring 21 has the similar structure to the p-type deep layer 5 as described above. The p-type guard ring 21 is different from the p-type deep layer 5 having a straight linear shape on the point that the p-type guard ring 21 has a linear shape surrounding the cell part RC and the connecting part RJ in a frame-like shape as an upper surface shape, but the other features of the p-type guard ring 21 are similar to those of the p-type deep layer 5. That is, the p-type guard ring 21 has the same width and the same thickness, that is, depth as the p-type deep layer 5. Further, the intervals of the p-type guard rings 21 may be equal. Alternatively, the p-type guard rings 21 may be arranged so that the intervals are narrower on the inner side, that is, on the cell part RC side and is increased toward an outer peripheral side in order to alleviate electric field concentration on the inner side and direct the equipotential lines toward the outer peripheral side.

Although not shown, an EQR structure is provided on the outer periphery of the p-type guard rings 21 as necessary, thereby forming the guard ring part RG provided with an outer peripheral withstand voltage structure surrounding the cell part RC.

A part connecting between the cell part Rc and the guard ring part RG is defined as the connecting part RJ. In the connecting part RJ, a plurality of connecting layers 30 are formed in the surface layer portion of the n−-type impurity layer 2. In the case of the present embodiment, as shown by the broken line hatching in FIG. 1, the connecting part RJ is formed on the outer periphery of the cell part RC so as to surround the cell part RC, and the plural p-type guard rings 21 each having a quadrangular shape with rounded four corners are formed so as to surround the outer periphery of the connecting part RJ. The p-type connection layers 30 are arranged in parallel with the p-type deep layers 5 formed in the cell part RC. In the present embodiment, the p-type connection layers 30 are arranged at equal intervals, which are equal to the intervals between the adjacent p-type deep layers 5. Further, in a place where the distance from the cell part RC to the p-type guard ring 21 is large, the p-type connection layer 30 is extended from the p-type deep layer 5, so that the distance from the tip portion of the p-type connection layer 30 to the p-type guard ring 21 is shortened.

Each of the p-type connecting layers 30 is arranged in a trench 30a that penetrates the n+-type source region 4 and the p-type base region 3 and reaches the n-type impurity layer 2. The p-type connecting layer 30 is provided by a p-type epitaxial film made by epitaxial growth. In a region between the cell part RC and the guard ring part RG, the p-type connecting layer 30 is connected to the tip of the p-type deep layer 5 in the longitudinal direction of the p-type deep layer 5. The trench 30a has, for example, a width of 1 μm or less and an aspect ratio of 2 or more. Since the p-type connection layer 30 is in contact with the p-type base region 3, the potential of the p-type connection layer 30 is fixed at the source potential.

Each part constituting the p-type connection layer 30 has the similar structure to the p-type deep layer 5 and the p-type guard ring 21 described above. The p-type connecting layer 30 is different from the frame-shaped p-type guard ring 21 on a point that the p-type connecting layer 30 has a straight linear shape as an upper surface shape, but the other features are the same. That is, the p-type connecting layer 30 has the same width and thickness, that is, depth as the p-type deep layer 5 and the p-type guard ring 21. In the present embodiment, the interval between the p-type connection layers 30 is equal to the interval between the p-type deep layers 5 in the cell part RC. Alternatively, the interval may be different from the interval between the p-type deep layers 5.

By forming the p-type connection layers 30 described above and setting the distance between the p-type connection layers 30 to be a predetermined distance, for example, to be equal to or less than the interval between the p-type deep layers 5, it is possible to suppress the equipotential line from excessively rising up in a region between the p-type connection layers 30. As such, it is possible to suppress the formation of a portion where the electric field concentration occurs between the p-type connection layers 30, and it is possible to suppress the reduction in breakdown voltage.

Further, the ion implantation layer 31 is formed by implanting ions into the portion of the connecting part RJ, which corresponds to the n$^+$-type source region 4 in the cell part RC. In the present embodiment, the entire upper part of the p-type base region 3 is provided by the ion implantation layer 31. The conductivity-type of the portion of the ion implantation layer 31 located on the side surface of the gate trench 6 is arbitrary. In this case, however, the conductivity-type is inverted to the p-type by ion-implanting a p-type impurity into the n$^+$-type source region 4 that is formed by the epitaxial growth.

Further, as shown in FIGS. 3 and 4, the gate liner 8b is extended out from the gate electrode 8 at the tip of the trench gate structure extended into the connecting part RJ. The interlayer insulating film 10 is also formed on the surfaces of the gate liner 8b and the ion implantation layer 31. A gate pad 32 and a drawing pad 33 for drawing out holes are formed above the interlayer insulating film 10 in the connecting part RJ at locations away from the cell part RC. The gate pad 32 is electrically connected to the gate liner 8b through a contact hole (not shown) formed in the interlayer insulating film 10. The drawing pad 33 is also electrically connected to the p-type connecting layer 30 and the ion implantation layer 31 through a contact hole (not shown) formed in the interlayer insulating film 10.

As described above, in the connecting part RJ, the side surface and the tip portion of the gate trench 6 are formed with the inclined portions. Specifically, the portion of the gate trench 6 corresponding to the position of the ion implantation layer 31 is formed as the inclined portion, and the inclined portion extends to the depth corresponding to the boundary position between the ion implantation layer 31 and the p-type base region 3. In the case of the present embodiment, the ion implantation layer 31 is formed in the entire area inside the connecting part RJ. Alternatively, the ion implantation layer 31 may be formed at least at portions forming the side surface and the tip portion of the gate trench 6 outside of the cell part RC. In such a configuration, the inclined portions can be formed entirely at positions of the side surfaces and the tip portions of the gate trenches 6 overlapping with the gate liner 8b.

The ion implantation layer 31 is provided entirely along the outer edge portion of the connecting part RJ. Therefore, as shown in FIG. 2, at the boundary position of the connecting part RJ with the outer edge portion of the mesa portion RM, that is, the boundary position with the recess portion 20, the ion implantation layer 31, the p-type base region 3, and the n-type current dispersion layer 2a are arranged in this order from the top. Therefore, the structure at the boundary position can be made different from an npn structure made of the n$^+$-type source region 4, the p-type base region 3, and the n-type current dispersion layer 2a in this order from the top, as in the case where the layer corresponding to the ion implantation layer 31 is left as the n$^+$-type source region 4.

As described above, the SiC semiconductor device according to the present embodiment is configured. In the SiC semiconductor device configured as described above, when the MOSFET is turned on, a channel region is formed in the surface portion of the p-type base region 3 located on the side surface of the gate trench 6 by controlling the voltage applied to the gate electrode 8. As a result, a current is caused to flow between the source electrode 9 and the drain electrode 11 via the n$^+$-type source region 4 and the n$^-$-type impurity layer 2.

In addition, even when a high voltage is applied at the time of turning off the MOSFET, since the p-type deep layer 5 is formed to extend the position deeper than the trench gate structure, entry of an electric field to the bottom of the gate trench is restricted by the p-type deep layer 5. As such, the electric field concentration at the bottom of the gate trench is reduced. As a result, breakdown of the gate insulation film 7 is suppressed.

Further, in the connecting part RJ, the rising of the equipotential lines is inhibited, and the equipotential lines are directed toward the guard ring part RG. In the guard ring part RG, the p-type guard ring 21 allows the equipotential lines to be terminated while the intervals of the equipotential lines being widened toward the outer peripheral side. Thus, a desired breakdown voltage can be achieved also in the guard ring part RG.

In the SiC semiconductor device having such a structure, the side surface of the inlet portion of the gate trench 6, which forms the trench gate structure, is perpendicular to the main surface of the n$^+$-type substrate 1 in the cell part RC. On the other hand, the side surface of the inlet portion of the gate trench 6 provides the inclined portion in the connecting part RJ. As a result, even if the gate insulating film 7 is formed as the thin film portion 7a in the cell part RC, it can be formed as the thick film portion 7b in the connecting part RJ. Therefore, it is possible to prevent the gate insulating film 7 from being destroyed due to a large electric field applied to both ends of the trench gate structure in the longitudinal direction, and hence the decrease in the life of the gate insulating film 7 can be suppressed.

If the holes are not properly pulled out from the outer periphery of the cell part RC at the time of avalanche breakdown of the vertical MOSFET, the withstand capacity of the SiC semiconductor device is likely to be lowered. Assumed that the connecting part RJ is not provided with the ion implantation layer 31, and the uppermost layer of the semiconductor is formed with the n$^+$-type source region 4 similarly to the cell part RC. In such a structure, since the PN junction is formed between the n$^+$-type source region 4 and the p-type base region 3, hole cannot be pulled out.

On the other hand, in the present embodiment, the uppermost layer of the semiconductor is provided by the ion implantation layer 31 made of the p-type layer. Therefore, by electrically connecting the drawing pad 33 formed above the interlayer insulating film 10 and the ion implantation layer 31 to each other, the holes can be pulled out from the p-type base region 3 via the ion implantation layer 31 and via the drawing pad 33. As such, the holes are satisfactorily pulled out from the outer periphery of the cell part RC at the time of the avalanche breakdown of the vertical MOSFET, and thus it is possible to suppress the decrease in the withstand capacity of the SiC semiconductor device.

In the SiC semiconductor device of the present embodiment, further, the boundary position between the mesa part RM and the recess portion 20 is formed of the ion implantation layer 31, the p-type base region 3, and the n-type current dispersion layer 2a in this order from the top. That is, the boundary position is formed not to have the npn structure made of the n$^+$-type source region 4, the p-type base region 3, and the n-type current dispersion layer 2a in this order from the top, as in the case where the ion implantation layer 31 is left as the n$^+$-type source region 4.

As will be described later, since the gate insulating film 7 and the gate electrode 8 are formed after the recess portion 20 and the gate trench 6 are formed, the trench gate structure having the similar structure is formed not only in the gate trench 6 but also in the recess portion 20. Therefore, the poly-Si, which is the material of the gate electrode 8 remaining in the recess portion 20, is removed later. However, as shown in FIG. 2, the poly-Si residue 8a may remain at the boundary position between the recess portion 20 and the mesa part RM.

In the case of such a structure and in which the boundary portion between the mesa part RM and the recess portion 20 has the npn structure, if the potential of the residue 8a having a floating potential rises due to an external charge or the like, an inverted channel is formed in the p-type base region 3. As a result, there may be a problem that a leak current flows through the source electrode 9 or the like electrically connected to the n$^+$-type source region 4.

On the other hand, by providing the ion implantation layer 31 made of the p-type layer as in the present embodiment, the npn structure is not formed and thus it is possible to suppress the occurrence of the leakage current even if there is the residue 8a remains.

Next, a method for manufacturing the SiC semiconductor device according to the embodiment will be described with reference to FIG. 6A to FIG. 6H.

Figure 6A:
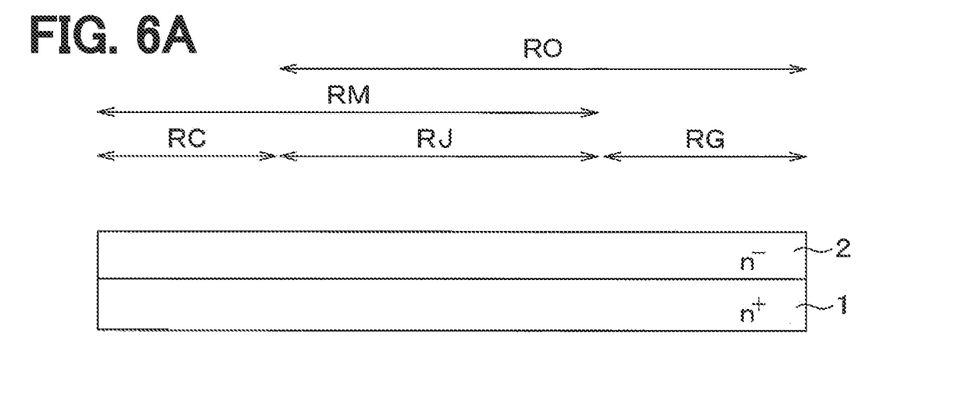
FIG. 6A is a cross-sectional view showing a process for manufacturing the SiC semiconductor device according to the first embodiment.

[Process Shown in FIG. 6A]

First, an n$^+$-type substrate 1 is prepared as a semiconductor substrate. Then, an n$^-$-type impurity layer 2 made of SiC is epitaxially grown on the main surface of the n$^+$-type substrate 1.

Figure 6B:
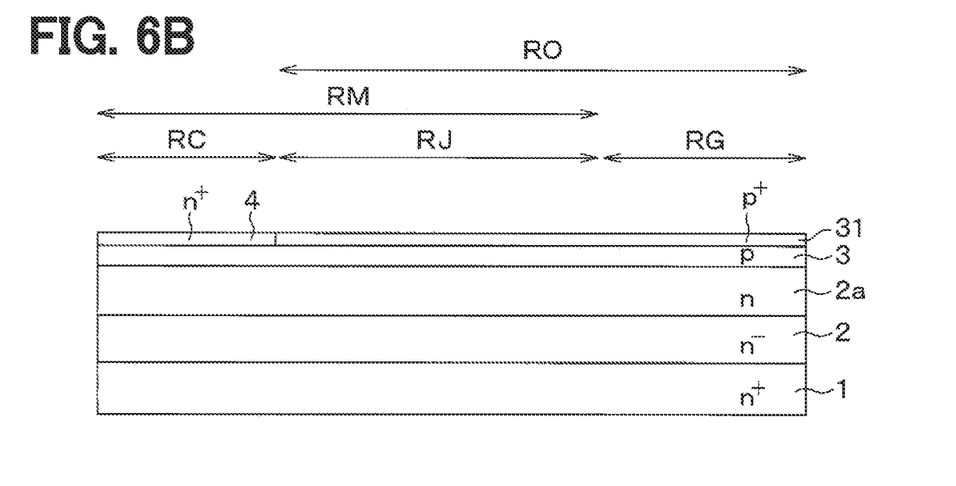
FIG. 6B is a cross-sectional view showing a process for manufacturing the SiC semiconductor device subsequent to FIG. 6A.

[Process Shown in FIG. 6B]

Subsequently, an n-type current dispersion layer 2a, a p-type base region 3 and an n$^+$-type source region 4 are epitaxially grown on the n$^-$-type impurity layer 2 in this order. Since the n$^+$-type source region 4 is formed by the epitaxial growth in this way, the thickness variation is distributed to each of the p-type base region 3 and the n$^+$-type source region 4. As such, the thickness variation of the p-type base region 3 is reduced, and hence the variation in the threshold value Vt can be suppressed.

Then, after placing a mask (not shown) on the n$^+$-type source region 4, a region of the mask corresponding to the region where an ion implantation layer 31 is to be formed is opened. The ion implantation layer 31 is formed by ion-implanting a p-type impurity, for example, aluminum, using the mask. At this time, the crystal structure of the ion-implanted portion is in a state of being damaged such as being distorted.

Figure 6C:
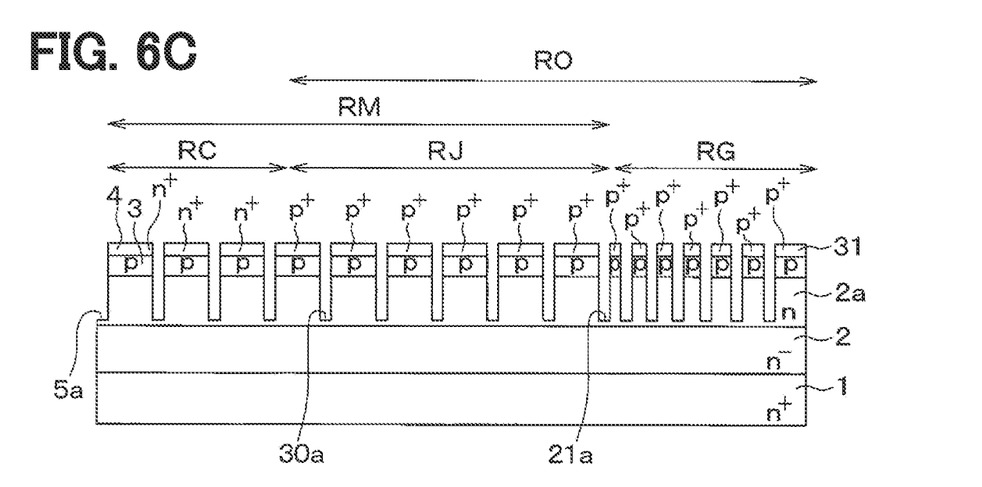
FIG. 6C is a cross-sectional view showing a process for manufacturing the SiC semiconductor device subsequent to FIG. 6B.

[Process Shown in FIG. 6C]

Next, a mask (not shown) is placed on the surfaces of the n$^+$-type source region 4 and the ion implantation layer 31, and regions of the mask corresponding to the portion where a p-type deep layer 5, a p-type guard ring 21, and a p-type connecting layer 30 are to be formed are opened. Then, anisotropic etching process such as a reactive ion etching (RIE) or the like is performed using the mask, thereby to form trenches 5a, 21a, and 30a.

Figure 6D:
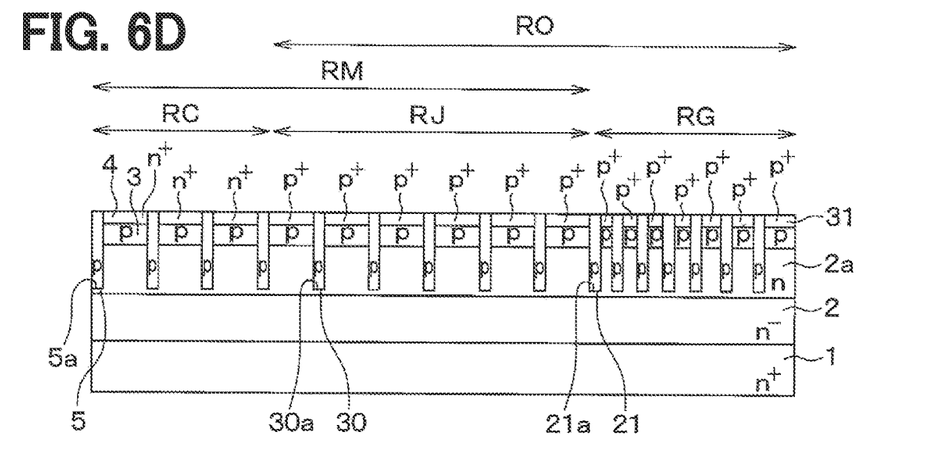
FIG. 6D is a cross-sectional view showing a process for manufacturing the SiC semiconductor device subsequent to FIG. 6C.

[Process Shown in FIG. 6D]

After the mask is removed and the p-type layer is formed, etching back is performed so as to remove a portion of the p-type layer formed above the surface of the n$^+$-type source region 4, so that the p-type deep layer 5, the p-type guard ring 21, and the p-type connecting layer 30 are formed.

At this time, p-type layers are filled in the trenches 5a, 21a, and 30a by an embedding epitaxial process. However, since the trenches 5a, 21a, and 30a are formed with the same width, it is possible to suppress occurrence of shape abnormality or unevenness on the surface of the p type layer. Therefore, the p-type layer can be reliably filled in each of the trenches 5a, 21a, and 30a, and the surface of the p-type layer has a flat shape with little unevenness.

As described above, the ion implantation layer 31 is formed in the process shown in FIG. 6B. Alternatively, the ion implantation layer 31 may be formed after forming the p-type deep layer 5, the p-type guard ring 21, and the p-type connecting layer 30. In such a case, it is possible to prevent damage repair from being performed due to the high temperature during the epitaxial growth and the ion implantation layer 31 having damages from being excessively etched during the etching back.

Figure 6E:
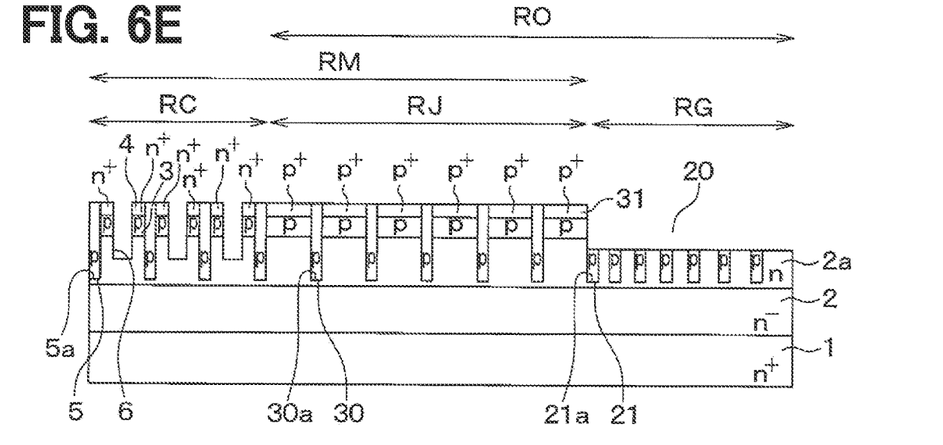
FIG. 6E is a cross-sectional view showing a process for manufacturing the SiC semiconductor device subsequent to FIG. 6D.

[Process Shown in FIG. 6E]

After a mask (not shown) is formed on the n$^+$-type source region 4 or the like, a region of the mask where a gate trench 6 is to be formed is opened. Then, an anisotropic etching such as RIE is performed with the use of the mask, thereby to form the gate trench 6.

Further, after the mask is removed, a mask (not shown) is formed again, and a region of the mask where a recess portion 20 is to be formed is opened. Then, an anisotropic etching such as RIE is performed with the use of the mask, thereby to form the recess portion 20. As a result, at the position where the recess portion 20 is formed, the n-type current dispersion layer 2a is exposed through the n$^+$-type source region 4 and the p-type base region 3. Thus, a structure in which a plurality of n-type guard rings 21 are arranged on the surface of the n-type current dispersion layer is formed.

In this case, the gate trench 6 and the recess portion 20 are formed in separate processes using different masks. Alternatively, the gate trench 6 and the recess portion 20 may be formed simultaneously using the same mask.

Figure 6F:
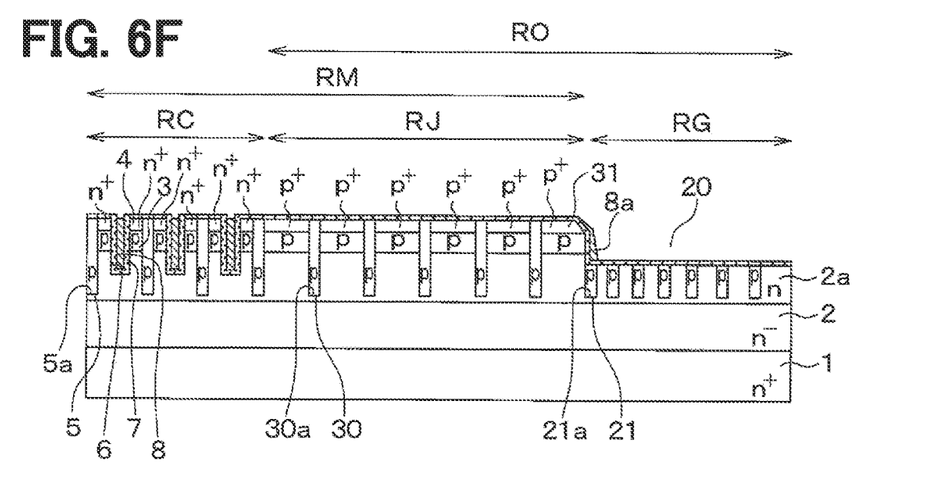
FIG. 6F is a cross-sectional view showing a process for manufacturing the SiC semiconductor device subsequent to FIG. 6E.

[Process Shown in FIG. 6F]

After removing the mask, the gate insulating film 7 is formed by thermal oxidation, so that the gate insulating film 7 covers the inner wall surface of the gate trench 6 and the surface of the n+-type source region 4. In this case, the n+-type source region 4, which has not been damaged by ion implantation, is thermally oxidized to the same extent as the p-type base region 3. On the other hand, the ion implantation layer 31, which has been damaged, is more likely to be thermally oxidized than the p-type base region 3. Therefore, in the cell part RC, the surface of the gate trench 6 on the inlet side of the gate trench 6 is kept substantially perpendicular to the main surface of the n+-type substrate 1. On the other hand, in the connecting part RJ, the surface of the gate trench 6 on the inlet side becomes the inclined portion. Therefore, at the corner portion on the inlet side of the gate trench 6, the gate insulating film 7 has the thin film portion 7a in the cell part RC, and has the thick film portion 7b in the connecting part RJ.

In this case, the inlet of the gate trench 6 is made to have the inclined portion in the connecting part RJ by performing the thermal oxidation, but the shape can be obtained by performing heat treatment. For example, oxidation of the ion implantation layer 31 in the connecting part RJ can be more promoted than the n+-type source region 4 in the cell part RC even by performing sacrificial oxidation. Thus, the inlet of the trench gate 6 in the connecting part RJ can be made to have the inclined portion. Therefore, in the case where the gate insulating film 7 is not formed by the thermal oxidation, for example, even if the gate insulating film 7 is formed by a chemical vapor deposition (CVD), the gate insulating film 7 is made to have the thin film portion 7a in the cell part RC, and the thick film portion 7b being thicker than the thin film portion 7a in the connecting part RJ.

Thereafter, a poly-Si doped with a p-type impurity or an n-type impurity is deposited, and then etched back to leave the poly-Si at least in the gate trench 6, thereby forming the gate electrode 8. As a result, the trench gate structure is formed.

The trench gate structure may be formed only in the gate trench 6. However, since the recess portion 20 is formed to have the mesa part RM, a similar structure is also formed in the recess portion 20. Although this portion is removed by etching back the poly-Si, a residue 8a may remain at the boundary position between the mesa part RM and the recess portion 20.

Figure 6G:
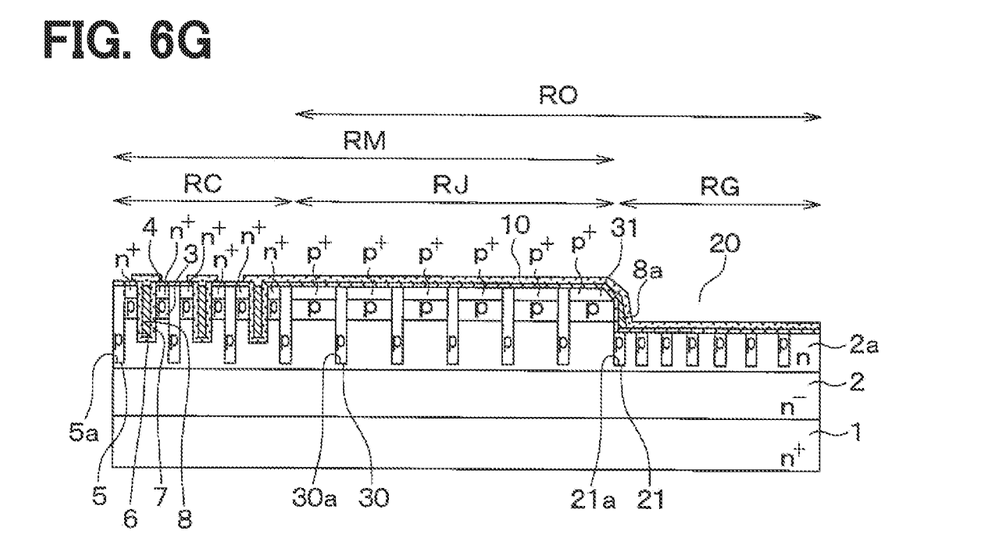
FIG. 6G is a cross-sectional view showing a process for manufacturing the SiC semiconductor device subsequent to FIG. 6F.

[Step Shown in FIG. 6G]

An interlayer insulating film 10 provided by, for example, an oxide film is formed so as to cover the surfaces of the gate electrode 8 and the gate insulating film 7. After a mask (not shown) is formed on the surface of the interlayer insulating film 10, a portion of the mask located between the gate electrodes 8, that is, a portion corresponding to the p-type deep layer 5 and the vicinity thereof is opened. Thereafter, the interlayer insulating film 10 is patterned using the mask to form a contact hole for exposing the p-type deep layer 5 and the n+-type source region 4. Further, a contact hole for partially exposing the gate electrode 8 and the ion implantation layer 31 is also formed at a position included in a cross section different from that shown in FIG. 6G.

Figure 6H:
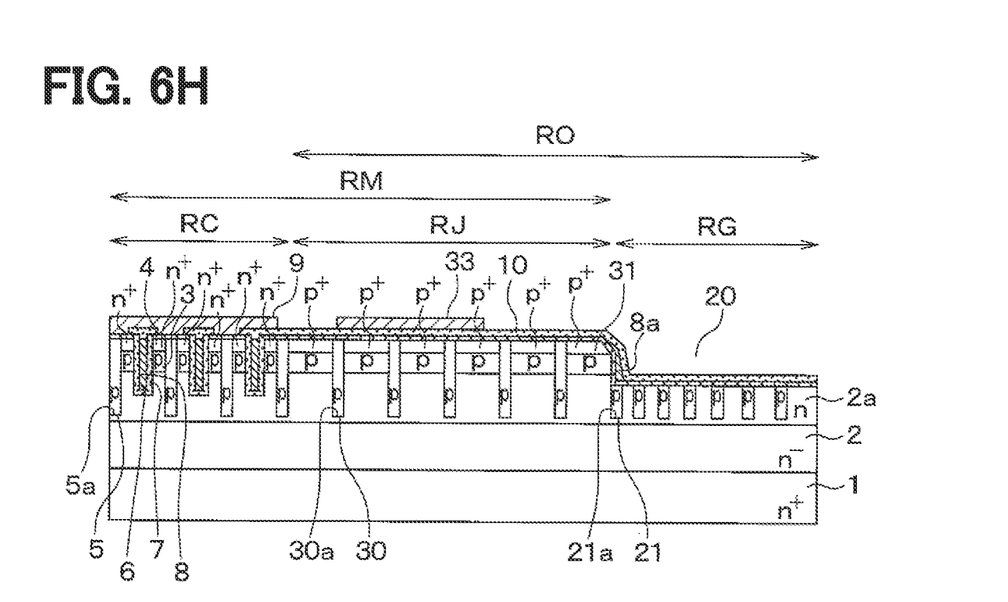
FIG. 6H is a cross-sectional view showing a process for manufacturing the SiC semiconductor device subsequent to FIG. 6G.

[Step Shown in FIG. 6H]

An electrode material having, for example, a multilayer structure of multiple metals is formed on the surface of the interlayer insulating film 10. Then, the electrode material is patterned, thereby to form the source electrode 9 and the drawing pad 33. Further, the gate pad 32 is also formed at a position included in a cross section different from that shown in FIG. 6H. A gate liner 8b connecting to the gate electrode 8 of each cell is provided at a position included in a cross section different from that shown FIG. 6H. A contact hole is formed in the interlayer insulating film 10 to be open at the position where the gate liner 8b is extended, so that the gate pad 32 and the gate electrode 8 are electrically connected. Similarly, a contact hole connecting to the ion implantation layer 31 is formed at a position included in a cross section different from that shown in FIG. 6H, and the extraction pad 33 and the ion implantation layer 31 are electrically connected through the contact hole.

Although a subsequent process is not shown, the SiC semiconductor device according to the present embodiment is completed by performing a process of forming a drain electrode 11 on the back surface of the n+-type substrate 1 or the like.

As described above, in the present embodiment, the side surface of the inlet portion of the gate trench 6, constituting the trench gate structure, is extended perpendicular to the main surface of the n+-type substrate 1 in the cell part RC, whereas is inclined as the inclined portion in the connecting part RJ. As a result, even if the gate insulating film 7 has the thin film portion 7a in the cell part RC, the gate insulating film 7 can be made to have the thick film portion 7b, which is thicker than the thin film portion 7a, in the connecting part RJ. Therefore, it is possible to suppress the gate insulating film 7 from being destroyed by application of a large electric field at both ends of the trench gate structure in the longitudinal direction, and hence it is possible to suppress a decrease in the life of the gate insulating film 7. Further, since the n+-type source region 4 is formed by the epitaxial growth, the thickness variation is distributed to each of the p-type base region 3 and the n+-type source region 4. As such, the thickness variation of the p-type base region 3 is reduced, and it is possible to suppress the variation of the threshold value Vt. Therefore, it is possible to obtain the SiC semiconductor device having a structure capable of suppressing the variation in the threshold value Vt and suppressing the decrease in gate life.

Other Embodiments

While the present disclosure has been described in accordance with the embodiment described above, the present disclosure is not limited to the embodiment and includes various modifications and equivalent modifications. In addition, various combinations and forms, and further, other combinations and forms including only one element, or more or less than these elements are also within the scope and the scope of the present disclosure.

(1) In the embodiment described above, the n+-type source region 4 is composed of only the epitaxial growth layer. Alternatively, the n+-type source region 4 may be composed of the epitaxial growth layer, as well as have an ion implanted region in the surface layer portion in order to increase the n-type impurity concentration. Even in such a case, since the boundary position between the n+-type source region 4 and the p-type base region 3 and their thickness are defined by the epitaxial growth, the effect of suppressing the variation of the threshold value Vt can be obtained. Further, in the case of such a structure, the side surface of the gate trench 6 may be inclined in the surface layer portion of the n+-type source region 4. However, since the ion implantation is performed only to the surface layer portion of the n+-type source region 4, the depth of the inclined portion of the side surface of the gate trench 6 is deeper in the part where the side surface of the gate trench 6 is made of the ion implantation layer 31 than the part where the side surface of the gate trench 6 is made of the n+-type source region 4. Then, at the lower position of the n+-type source region 4, that is, the portion in contact with the p-type base region 3, the side surface of the gate trench 6 has a structure that is perpendicular to the main surface of the n⁺-type substrate 1.

(2) In each of the embodiments described above, the n-channel type inverted trench gate MOSFET is described as an example of the vertical power element. However, each of the embodiments described above is merely an example of a vertical semiconductor element having a trench gate structure, and may have another structure or another conductivity-type as long as a vertical semiconductor element that allows a current to flow between a first electrode provided on a front surface of the semiconductor substrate and a second electrode provided on a back surface of the semiconductor substrate.

For example, in the first embodiment and the like, the n-channel type MOSFET in which a first conductivity type is the n-type and a second conductivity type is the p-type has been exemplified. Alternatively, the semiconductor element may be a p-channel type MOSFET in which the conductivity types of the respective components are inverted from those of the n-channel type MOSFET. In the above description, the MOSFET is described as an example of the semiconductor element. Alternatively, the present disclosure may also be applied to an IGBT having a similar structure. In the IGBT, only the conductivity type of the n⁺-type substrate 1 is changed from the n-type to the p-type with respect to each of the embodiments described above, and other structures and manufacturing methods are the same as those of the embodiments described above.

Figure 7:
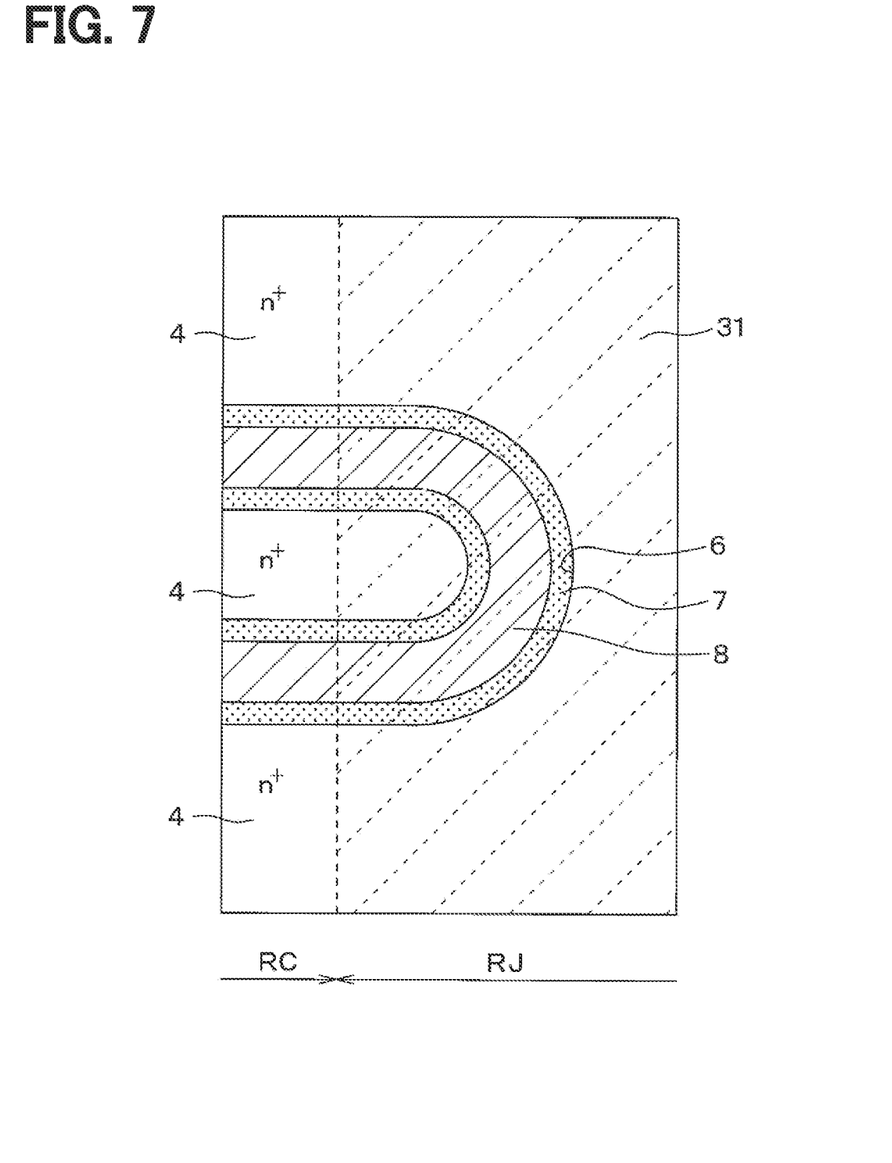
FIG. 7 is a diagram schematically showing a layout of an upper surface of a tip portion of a trench gate structure in a SiC semiconductor device according to another embodiment.

(3) In the embodiment described above, the trench gate structure is only provided by a mere linear portion. On the other hand, the trench gate structure may have a configuration in which both ends of the adjacent gate trenches 6 are connected together in a semicircular shape on the outside of the cell part RC, that is, in the connecting part RJ, so that the gate trench 6 has an oval shape when viewed from the top, as shown in FIG. 7. Also in such a case, the entire area around the semicircular portion located at the tip of the gate trench 6 than the linear portion may be provided by the ion implantation layer 31, so that the side surface of the gate trench 6 is inclined.

(5) Further, in the embodiments described above, the ion implantation layer 31 is the p-type layer. However, it is not always necessary that the ion implantation layer 31 is the p-type layer as long as having the purpose of inclining the side surface of the gate trench 6. The ion implantation layer 31 may be an n-type layer. Further, although aluminum is used as an example of the doping source for ion implantation, an n-type impurity such as nitrogen may be used, or an inert element such as carbon, silicon, or argon that does not serve as an impurity may be used.

The invention claimed is:

1. A silicon carbide semiconductor device provided with an inverted vertical semiconductor element having a trench gate structure in a cell part, the silicon carbide semiconductor device comprising:
   a substrate of a first conductivity type or a second conductivity type, the substrate being made of silicon carbide, and having a main surface;
   a drift layer of the first conductivity type, the drift layer being made of the silicon carbide and having an impurity concentration lower than that of the substrate, the drift layer being disposed adjacent to the main surface of the substrate;
   a base region of the second conductivity type, the base region being made of the silicon carbide and disposed above the drift layer;
   a source region of the first conductivity type, the source region having an impurity concentration higher than that of the drift layer and being disposed in the cell part above the base region, the source region having an epitaxial layer of the silicon carbide at least at a part being in contact with the base region,
      the trench gate structure being disposed in a gate trench, and including a gate insulating film disposed on an inner wall surface of the gate trench and a gate electrode disposed on the gate insulating film, the gate trench having a depth from a front surface of the source region to a position deeper than the base region, the gate trench including a linear portion that defines a longitudinal direction in a direction and extends from the cell part to a position outside of the cell part;
   an interlayer insulating film being disposed above the source region and the trench gate structure, and having a contact hole connecting to the source region;
   a first electrode being disposed on the interlayer insulating film and electrically connected to the source region through the contact hole; and
   a second electrode being electrically connected on a back surface side of the substrate, wherein
   a side surface of an inlet portion of the gate trench outside of the cell part is inclined relative to a normal direction to the main surface of the substrate, so that an angle of inclination of the side surface of the inlet portion of the gate trench outside of the cell part relative to the normal direction is greater than an angle defined between a side surface of the gate trench in the cell part provided by the epitaxial layer of the source region that is in contact with the base region and the normal direction;
   the inclined side surface of the inlet portion of the gate trench outside of the cell part is provided by an ion implantation layer disposed above the base region; and
   the inclined side surface of the inlet portion of the gate trench outside of the cell part extends from an upper surface of the ion implantation layer to a boundary between the ion implantation layer and the base region.

2. The silicon carbide semiconductor device according to claim 1, wherein
   the gate electrode has a gate liner in the region outside of the cell part, and
   the side surface of the inlet portion of the gate trench is provided by the ion implantation layer at a position corresponding to the gate liner.

3. The silicon carbide semiconductor device according to claim 1, wherein
   the ion implantation is provided by a second conductivity type layer.

4. The silicon carbide semiconductor device according to claim 3, further comprising:
   an outer peripheral part surrounding the cell part, wherein
   the outer peripheral part is also provided with the ion implantation layer, which is made of the second conductivity type layer and disposed above the base region, and the interlayer insulating film, which is disposed on the ion implantation layer,
   the outer peripheral part is further provided with a drawing pad disposed above the interlayer insulating film, and
   the drawing pad is electrically connected to the ion implantation layer through a contact hole provided in the interlayer insulating film.

5. The silicon carbide semiconductor device according to claim 4, wherein the outer peripheral part includes a guard ring part surrounding an outer periphery of the cell part and a connecting part located between the cell part and the guard ring part, the drift layer in the guard ring part is recessed from the drift layer in the cell part to form a recess portion, thereby to form an island-shaped mesa part at which the cell part and the connecting part are protruded from the guard ring part in a thickness direction of the substrate, the ion implantation layer is provided at an outer edge portion of the connecting part, and the drift layer, the base region and the ion implantation layer are disposed on top of one another at a boundary position between the mesa part and the recess portion.

6. The silicon carbide semiconductor device according to claim 5, wherein the ion implantation layer covers an entirety of the connecting part.

7. The silicon carbide semiconductor device according to claim 1, wherein the gate insulating film includes a first film portion that is disposed on the side surface of the gate trench in the cell part provided by the epitaxial layer of the source region and a second film portion that is disposed on the inclined side surface of the inlet portion of the gate trench outside of the cell part provided by the ion implantation layer, and a thickness of the second film portion is greater than a thickness of the first film portion.

8. The silicon carbide semiconductor device according to claim 3, wherein the ion implantation layer provided by the second conductivity type layer has an impurity concentration higher than that of the base region.

* * * * *